(12) United States Patent
Kim (10) Patent No.: US 7,295,256 B2
(45) Date of Patent: Nov. 13, 2007

(54) METHOD FOR FORMING PATTERN OF LIQUID CRYSTAL DISPLAY DEVICE AND METHOD FOR FABRICATING THIN FILM TRANSISTOR ARRAY SUBSTRATE OF LIQUID CRYSTAL DISPLAY DEVICE USING THE SAME

(75) Inventor: Jin Ook Kim, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 228 days.

(21) Appl. No.: 10/934,497

(22) Filed: Sep. 7, 2004

(65) Prior Publication Data

US 2005/0052583 A1    Mar. 10, 2005

(30) Foreign Application Priority Data

Sep. 8, 2003    (KR) .................. 10-2003-0062748

(51) Int. Cl.
*G02F 1/136*    (2006.01)
(52) U.S. Cl. .......................................... 349/43; 438/30
(58) Field of Classification Search ............... 349/43; 438/30; 257/59
See application file for complete search history.

(56) References Cited

U.S. PATENT DOCUMENTS 6,897,099 B2 *    5/2005    Yoo et al. .................. 438/149

2002/0153566 A1 *    10/2002    Hwang .................. 257/347
2004/0266039 A1 *    12/2004    Ahn et al. .................. 438/30

FOREIGN PATENT DOCUMENTS

JP    6-283842 A    10/1994

* cited by examiner

*Primary Examiner*—Mike Qi
*Assistant Examiner*—David Chung
(74) *Attorney, Agent, or Firm*—Birch, Stewart, Kolasch & Birch, LLP (57) ABSTRACT

A method for forming a pattern of a liquid crystal display device is provided. The method includes providing a substrate having a layer to be patterned, providing a master substrate having an intaglio portion corresponding to a desired pattern, filling an organic material into the intaglio portion of the master substrate, placing the master substrate in contact with the substrate, hardening the organic material to produce a hardened organic film pattern, transferring the hardened organic film pattern onto a surface of the layer to be patterned by separating the master substrate from the substrate, and etching the layer to be patterned by using the organic film pattern as a mask.

26 Claims, 8 Drawing Sheets

METHOD FOR FORMING PATTERN OF LIQUID CRYSTAL DISPLAY DEVICE AND METHOD FOR FABRICATING THIN FILM TRANSISTOR ARRAY SUBSTRATE OF LIQUID CRYSTAL DISPLAY DEVICE USING THE SAME

The present application claims the benefit of Korean Patent Application No. 2003-62748 filed Sep. 8, 2003, the entire contents of which are herein fully incorporated by reference.

BACKGROUND OF THE INVENTION

1. Field of the Invention

The present invention relates to a method for forming a pattern of a liquid crystal display device, and more particularly, to a method for forming a pattern of a liquid crystal display device using a microtransfer method, a non-photolithography method, and a method for fabricating a thin film transistor array substrate of a liquid crystal display device using the same.

2. Description of the Related Art

As the interest in an information display and the demand for a portable information media increase, researches on a light flat panel display (FPD) substituting for a cathode ray tube (CRT) are preponderantly ongoing. Particularly, a liquid crystal display device of such flat panel displays is a device for displaying an image using optical anisotropy of a liquid crystal and is being actively used for a notebook computer or a desktop monitor because of its excellent resolution, color display and image quality.

A general liquid crystal display device displays an image by controlling the light transmittance of a liquid crystal by using an electric field. To this end, a liquid crystal display device largely includes a color filter substrate, an array substrate and a liquid crystal layer formed between the color filter substrate and the array substrate.

Figure 1:
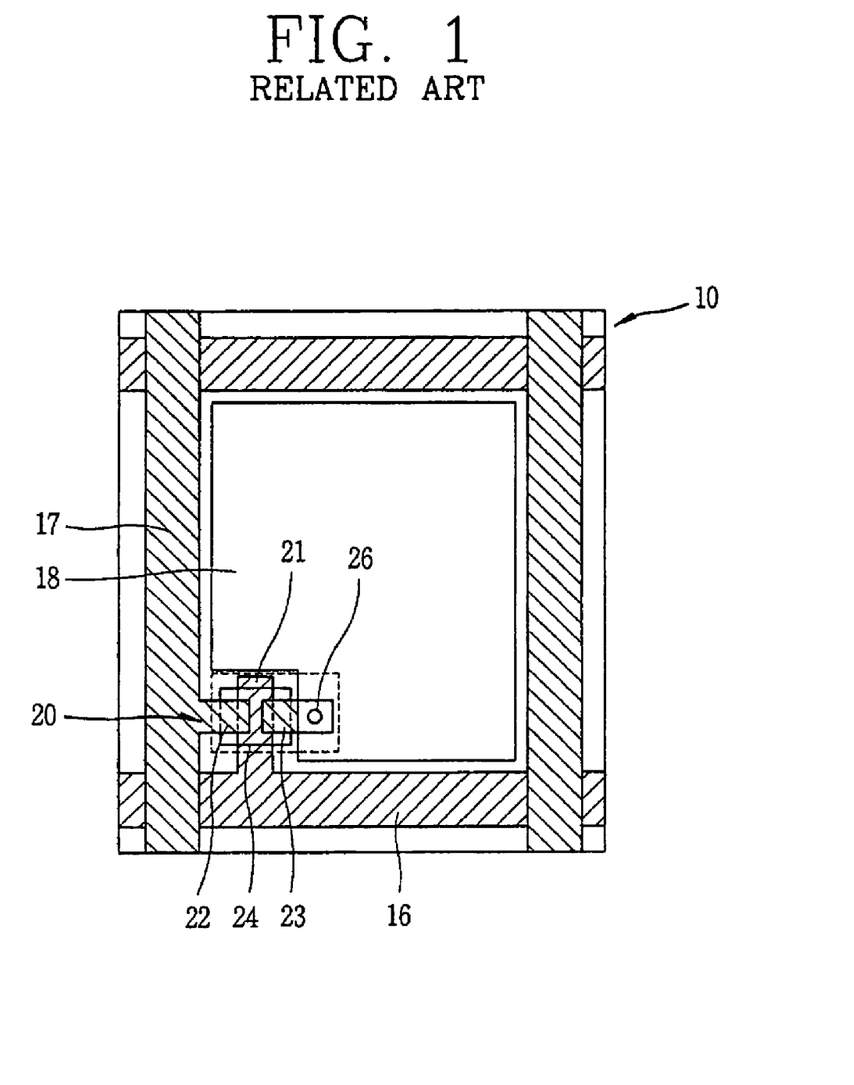
FIG. 1 is a partial plan view of an array substrate for a liquid crystal display device according to a related art.

FIG. 1 is a partial plan view of one pixel region of an array substrate for a liquid crystal display device according to a related art. It is known that the array substrate has a plurality of such pixel regions.

In FIG. 1, the array substrate 10 includes a pixel electrode 18 formed on a pixel region, a gate line 16 and a data line 17 arranged horizontally and vertically on the substrate 10, and a thin film transistor (TFT) 20 (a switching element) formed at an intersection of the gate line 16 and the data line 17.

The thin film transistor 20 includes a gate electrode 21 connected to the gate line 16, a source electrode 22 connected to the data line 17 and a drain electrode 23 connected to the pixel electrode 18. The thin film transistor 20 includes a first insulating film (not shown) for insulating the source/drain electrode 22, 23 and an active layer 24 forming a conductive channel between the source electrode 22 and the drain electrode 23 by a gate voltage supplied to the gate electrode 21. In addition, a second insulating film (not shown) having a contact hole 26 is formed on the drain electrode 23, so that the drain electrode 23 and the pixel electrode 18 are electrically connected through the contact hole 26.

Here, the pixel region means an image-displayed region defined by the intersection of the gate line 16 and the data line 17. The pixel electrode 18 formed on the pixel region is made of a transparent conductive material having excellent light transmittance, such as Indium Tin Oxide (ITO).

The array substrate constructed as above constitutes a liquid crystal display panel by being attached to the color filter substrate by a sealant, and the attachment of these two substrates is made through an attachment key formed at the array substrate or the color filter substrate.

Meanwhile, in fabricating a liquid crystal display, a plurality of mask processes (i.e., photolithography process) are needed to fabricate an array substrate including thin film transistors. Therefore, in order to improve productivity, a method for reducing the number of mask processes is required.

Hereinafter, a process for fabricating a general liquid crystal display device will now be described in detail with reference to FIGS. 2A to 2G.

FIGS. 2A to 2G are flow charts showing a fabrication process of a liquid crystal display device shown in FIG. 1, and particularly, a fabrication process of an array substrate including a thin film transistor is shown.

Figure 2A:
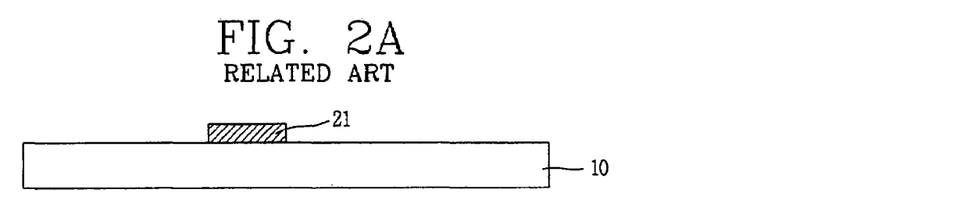
FIGS. 2A to 2G are flow charts showing a process for fabricating a liquid crystal display device shown in FIG. 1.

First, as shown in FIG. 2A, a gate electrode 21 is formed on a substrate 10 made of a transparent insulating material such as glass. The gate electrode 21 is formed such that gate metal is deposited at the entire surface of the substrate 10, which then passes through a photolithography process.

Figure 2B:
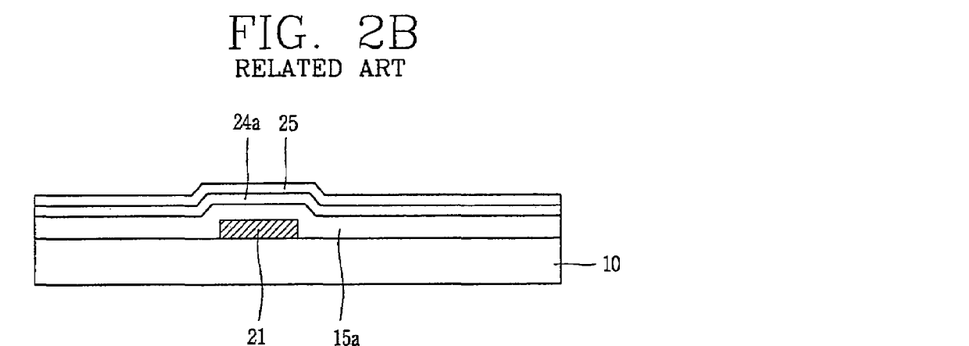

Then, as shown in FIG. 2B, a first insulating film 15a which is a gate insulating film, an amorphous silicon thin film 24a and an n+ amorphous silicon thin film 25 are deposited at the entire surface of the substrate on which the gate electrode 21 is formed in turn. The amorphous silicon thin film 24a is patterned to be used as an active layer of the thin film transistor, and the n+ amorphous silicon thin film 25 is formed for ohmic-contact between the source/drain electrodes and source/drain regions of the active layer.

Figure 2C:
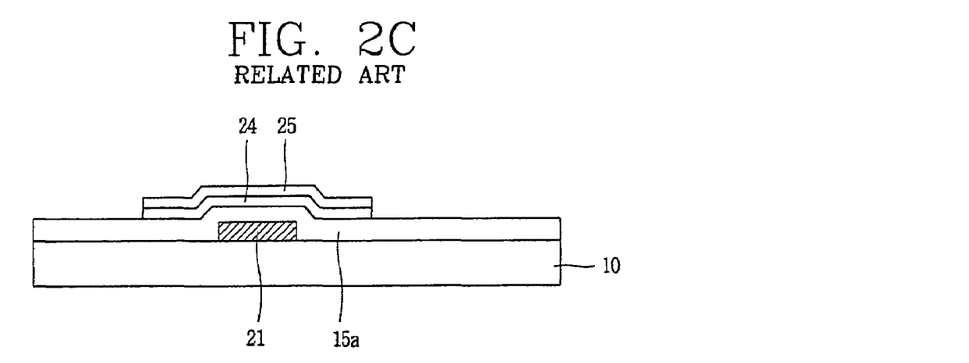

Then, as shown in FIG. 2C, the first insulating film 15a, the amorphous silicon thin film 24a and the n+ amorphous silicon thin film 25 are patterned through a photolithography process, thereby forming a gate insulating film 15 pattern, an active pattern 24, and a patterned film 25.

Figure 2D:
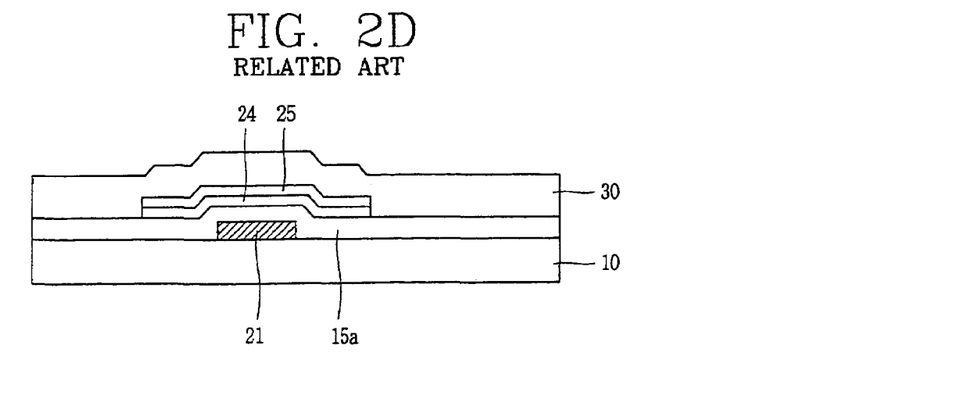

Thereafter, as shown in FIG. 2D, a conductive metal 30 for forming source/drain electrodes is deposited at the entire surface of the substrate 10.

Figure 2E:
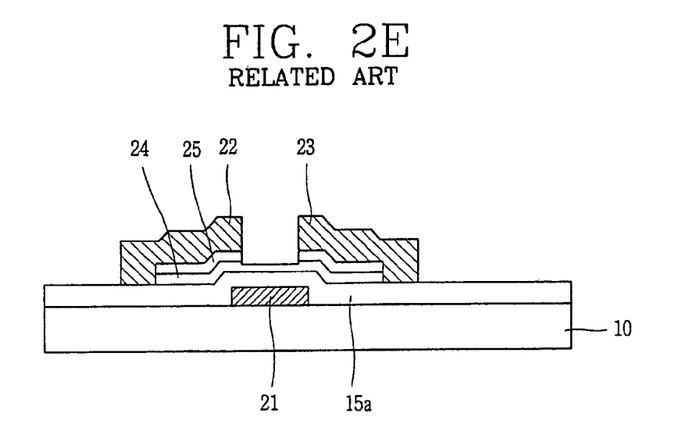

Next, as shown in FIG. 2E, the conductive metal 30 is patterned through a photolithography process, thereby forming a source electrode 22 and a drain electrode 23. Here, the conductive metal 30 and the n+ amorphous silicon thin film 25 are completely removed except for their portions corresponding to the source/drain electrodes 22, 23 patterns.

Figure 2F:
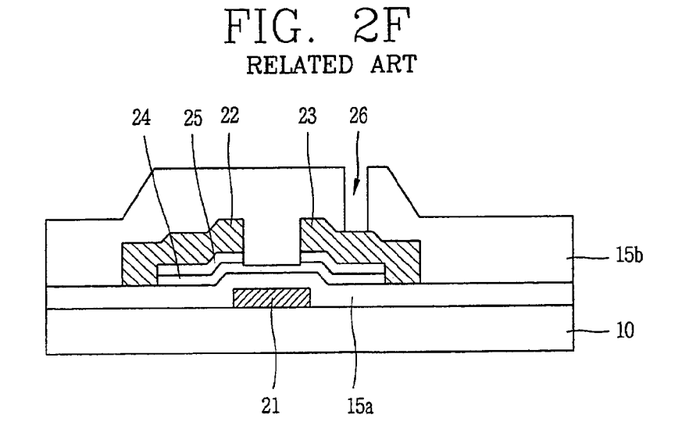

Next, as shown in FIG. 2F, a second insulating film 15b is deposited at the entire surface of the substrate 10, and then a contact hole 26 exposing a part of the drain electrode 23 is formed through a photolithography process.

Figure 2G:
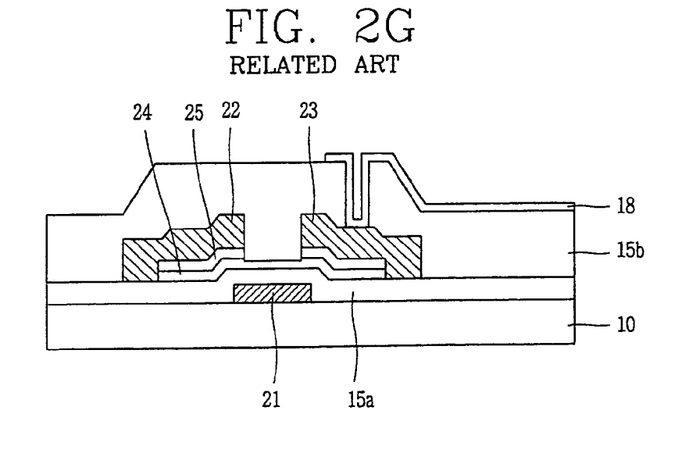

Lastly, as shown in FIG. 2G, a transparent conductive material such as Indium Tin Oxide (ITO) is deposited at the entire surface of the substrate 10 on which the second insulating film 15b is formed, and then a pixel electrode 18 connected to the drain electrode 23 through the contact hole 26 is formed through a photolithography process.

As discussed above, in order to fabricate such a liquid crystal display device, several deposition processes and photolithography processes have to be performed. Particularly, in fabricating an array substrate including a thin film transistor array as described above, a plurality of photolithography processes are required to form a gate electrode, an active pattern, a source/drain electrodes, a contact hole and a pixel electrode.

The photolithography technology includes a plurality of complex processes, such as the application of photosensitive material, alignment, exposure, development or the like as a series of processes for forming a desired pattern by transcribing a pattern drawn on a mask onto a substrate where a thin film is deposited.

In the exposure process, a mask is disposed at a proper position, align keys of the mask and the substrate are aligned, and then a light source is radiated. Here, however, because of the limitation of the exposure equipment, it is difficult to make the accurate alignment. Accordingly, there is a limit to forming a fine pattern which requires high precision, and productivity is deteriorated since a plurality of photolithography process need to be repeated.

In addition, since a mask designed to form a pattern is very expensive, as the number of masks used during the process is increased, the fabrication cost of a liquid crystal display device is increased in proportion to the increased number of masks.

SUMMARY OF THE INVENTION

Accordingly, the present invention is directed to a method for forming a pattern of a liquid crystal display device that substantially obviates one or more of the problems due to limitations and disadvantages of the related art.

An object of the present invention is to provide a method for forming a pattern of a liquid crystal display device capable of forming a pattern through one process by a microtransfer method, which is a non-photolithography method.

Another object of the present invention is to provide a method for forming a pattern for forming a gate electrode and an active pattern of a thin film transistor by the microtransfer method, and to provide a method for fabricating a TFT array substrate of a liquid crystal display device using this pattern forming method.

To achieve these and other advantages and in accordance with the purpose of the present invention, as embodied and broadly described, a method for forming a pattern of a liquid crystal display device, includes providing a substrate having a layer to be patterned; providing a master substrate having an intaglio portion corresponding to a desired pattern; filling an organic material into the intaglio portion of the master substrate; placing the master substrate in contact with the substrate; hardening the organic material to produce a hardened organic film pattern; transferring the hardened organic film pattern onto a surface of the layer to be patterned by separating the master substrate from the substrate; and etching the layer to be patterned by using the organic film pattern as a mask.

In another aspect of the present invention, there is provided a method for fabricating a thin film transistor (TFT) array substrate for a liquid crystal display device, comprising providing a first substrate; forming a gate metal on the first substrate; transferring a first organic film pattern onto the gate metal; forming a gate electrode by etching the gate metal by using the first organic film pattern as a mask; depositing a first insulating film, an amorphous silicon thin film and an n+ amorphous silicon thin film on the first substrate on which the gate electrode is formed; forming an active pattern by patterning the n+ amorphous silicon thin film and the amorphous silicon thin film; forming a source electrode and a drain electrode on the active pattern; forming a second insulating film having a contact hole exposing a part of the drain electrode; and forming a pixel electrode electrically connected to the drain electrode through the contact hole.

In another aspect of the present invention, there is provided a method for fabricating a thin film transistor (TFT) array substrate of liquid crystal display device, comprising providing a first substrate; forming a gate electrode on the first substrate; depositing a first insulating film, an amorphous silicon thin film and an n+ amorphous silicon thin film on the first substrate on which the gate electrode is formed; transferring an organic film pattern onto the first substrate; forming an active pattern by etching the n+ amorphous silicon thin film and the amorphous silicon thin film by using the organic film pattern as a mask; forming a source electrode and a drain electrode on the active pattern; forming a second insulating film having a contact hole exposing a part of the drain electrode; and forming a pixel electrode electrically connected to the drain electrode through the contact hole.

In another aspect of the present invention, there is provided a method of forming a pattern of a display device, comprising providing a mold layer having a groove filled with a photosensitive material; hardening the photosensitive material; transferring the hardened photosensitive material onto a surface of a layer to be patterned; and patterning the layer to be patterned by using the transferred photosensitive material as a mask.

It is to be understand that both the foregoing general description and the following detailed description are exemplary and explanation and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to embodiments of the present invention, examples of which are illustrated in the accompanying drawings.

In general, a pattern of a liquid crystal display device is formed by using a photolithography technology. However, as the size of a substrate becomes large and the size of a pattern becomes small, the photolithography method requires expensive equipment, precision and the like, which makes the application thereof difficult and expensive.

In order to solve such a problem, a non-photolithography technology substituting for the photolithography technology has been proposed. As the non-photolithography technology, there are a microcontact printing (μCP), a replica molding (REM), a microtransfer molding (μTM), a micromolding in capillaries, and a solvent-assisted micromolding.

Such technologies are methods wherein a desired pattern is transcribed onto a substrate by using an elastic rubber stamp for printing, a mold or the like, and have high resolutions of 30 nm~1 μm. The stamp or the mold is made of an elastomer, which is an elastic polymer of natural rubber or synthetic rubber. Especially, these technologies are advantageous in that a large pattern can be easily formed at a low cost compared to the related art photolithography method.

Accordingly, the present invention provides a method for forming a pattern of a liquid crystal display by using a microtransfer method, which is a non-photolithography technology.

As for the microtransfer method, organic material such as photosensitive material is injected into a pattern formed at a mold, and then the photosensitive film pattern is transferred to a substrate on which a predetermined layer to be patterned is formed, so that a desired pattern can be formed. Here, the transfer of the photosensitive film pattern is made in such a manner that the mold having a pattern filled with the photosensitive material and the substrate contact each other. Then the photosensitive material is hardened by radiating light such as ultraviolet (UV) light thereto and is absorbed onto the substrate.

FIGS. 3A to 3M are flow charts showing a process of fabricating a liquid crystal display device in accordance with a first embodiment of the present invention, and particularly, show a process for fabricating an array substrate including a thin film transistor by a microtransfer method.

Figure 3A:
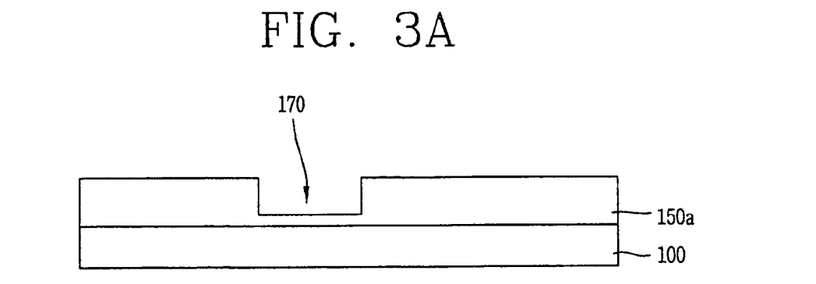
FIGS. 3A to 3M are flow charts showing a process for fabricating a liquid crystal display device by a microtransfer method in accordance with a first embodiment of the present invention.

First, as shown in FIG. 3A, a master substrate 100 having a first mold 150a including an intaglio portion at its upper portion is provided. The master substrate 100 may be made of a transparent insulating material such as glass, and the first mold 150a has a concave intaglio portion 170 corresponding to a gate electrode pattern.

In addition, the first mold 170 may be made of an elastic resin such as polydiethylsiloxane (PDMS), polyurethane or polyimide. Especially, the PDMS is a transparent elastomer, an elastic polymer such as natural rubber, synthetic rubber or the like, and a surface of the PDMS has small interfacial free energy and is not chemically activated, easily. In addition, the PDMS can maintain elasticity for a long time, so it is proper to form a high quality pattern.

Here, the master substrate 100 is for preventing the first mold 150a from being bent, and it may be fabricated together with the first mold 150a or may be attached to the first mold 150a after being fabricated in a process separate from the first mold 150a.

Figure 3B:
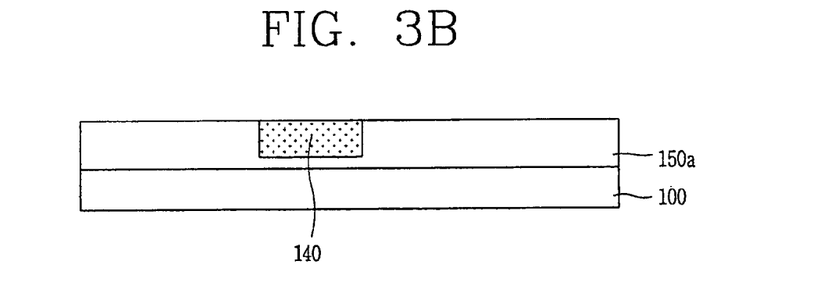

Thereafter, as shown in FIG. 3B, the intaglio portion 170 of the first mold 150a is filled with a photosensitive material 140 such as photoresist. Here, as a method for injecting the photosensitive material 140 into the intaglio portion 170, spin coating, ink-jet printing, knife jetting, etc., can be used.

Figure 3C:
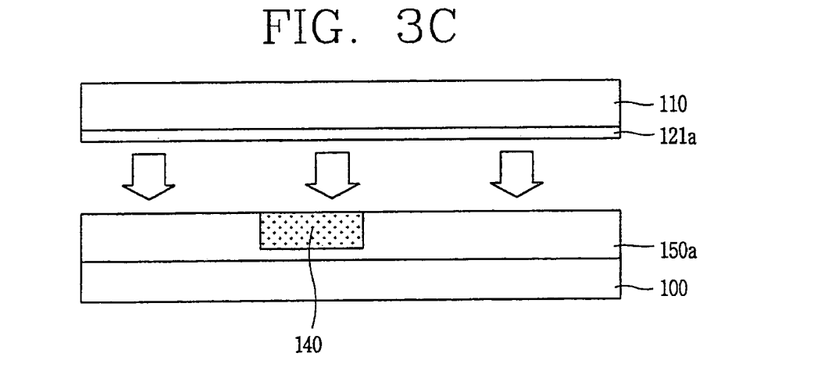

Next, as shown in FIG. 3C, a surface of a substrate 110 on which a layer to be patterned is formed contacts a surface of the first mold 150a. Here, a gate metal 121a for forming a gate electrode pattern has already been deposited on the entire surface of the substrate 110.

Figure 3D:
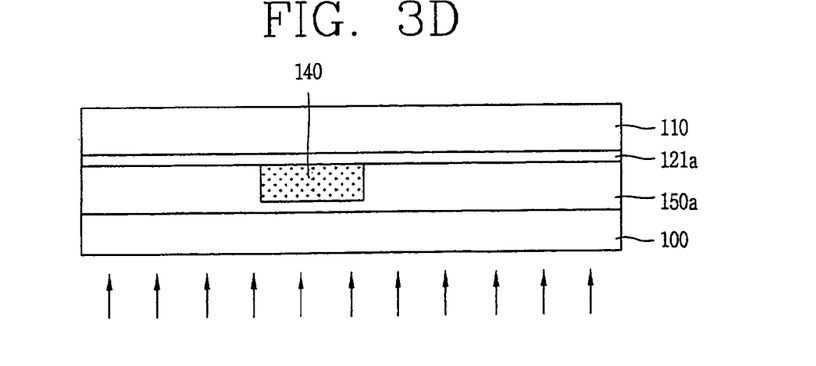

Thereafter, as shown in FIG. 3D, light such as ultraviolet light is radiated onto the resultant structure to thereby harden the photosensitive material 140. Here, the light should be radiated from a lower side of the master substrate 100 since the opaque gate metal 121a is deposited on the array substrate which is in contact with an upper portion of the master substrate 100.

A light source which can harden the photosensitive material 140 (a photosensitive resin) is enough for the radiated light, and the radiation can be made by a scan method.

Figure 3E:
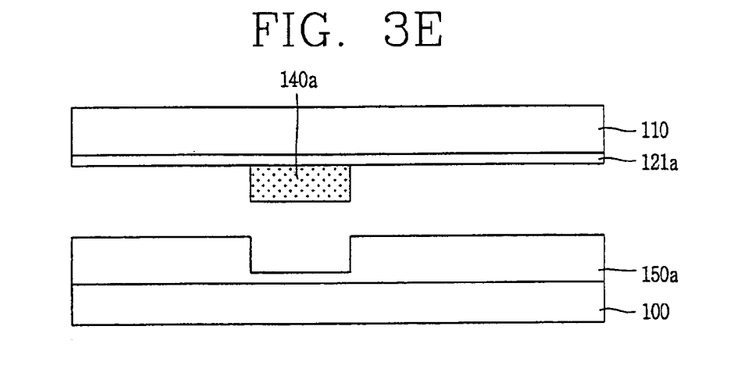

Next, as shown in FIG. 3E, when the master substrate 100 is detached from the array substrate 110, the photosensitive film pattern 140a having a good adherence property to metal is adhered onto the surface of the gate metal 121a of the array substrate 110 so as to be transferred thereto.

Figure 3F:
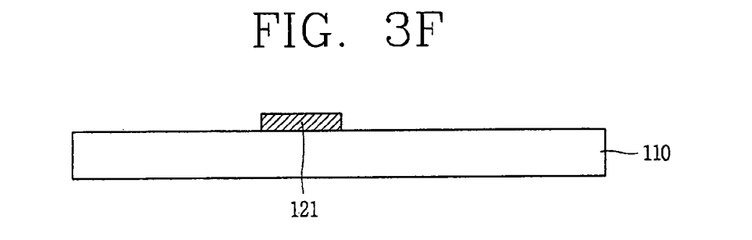

And, as shown in FIG. 3F, the gate metal 121a is etched by using the transferred photosensitive film pattern 140a as a mask to thereby form a gate electrode 121 pattern on the substrate 110.

Figure 3G:
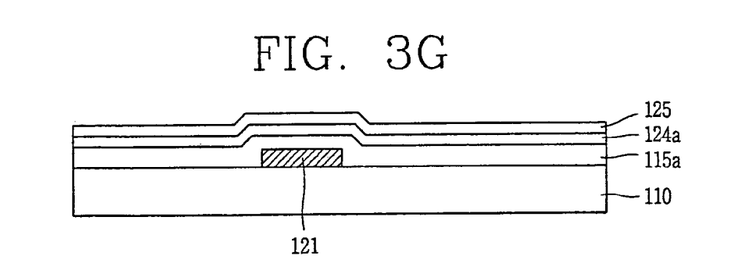

Next, as shown in FIG. 3G, a first insulating film 115a which is a gate insulating film, an amorphous silicon thin film 124a and an n+ amorphous silicon thin film 125 are deposited at the entire surface of the substrate 110 on which the gate electrode 121 is formed in turn. The amorphous silicon thin film 124a is patterned to be used as an active layer of the thin film transistor, and the n+ amorphous silicon thin film 125 is formed for ohmic-contact between the source/drain electrodes and the source/drain regions of the active layer.

Figure 3H:
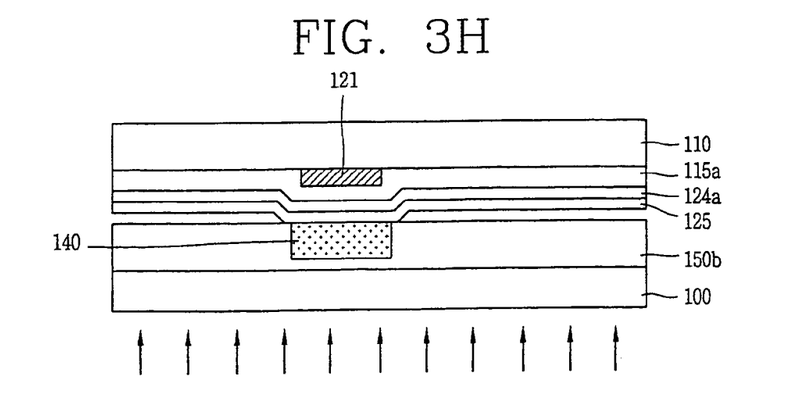

Next, as shown in FIG. 3H, in order to form an active pattern, the master substrate 100 having a second mold 150b and the photosensitive material 140 as in FIG. 3B, is used. The substrate 110 and the master substrate 100 having the second mold 150b contact each other, and then light is radiated from a lower side of the master substrate 100. Here, the second mold 150b has a concave groove corresponding to an active pattern, and the photosensitive material 140 is injected into the groove.

Again, the photosensitive material 140 injected into the second mold 150b is hardened by the radiated light and transferred to the surface of the n+ amorphous silicon thin film 125 of the substrate 110.

Figure 3I:
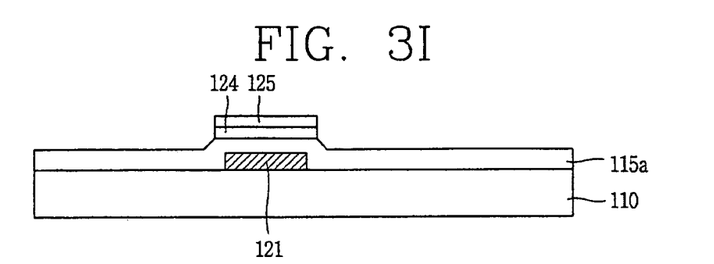

Next, as shown in FIG. 3I, the n+ amorphous silicon thin film 125 and the amorphous silicon thin film 124a are etched by using the transferred photosensitive film pattern 140 as a mask, thereby forming an active pattern 124 and an ohmic contact layer 125.

Figure 3J:
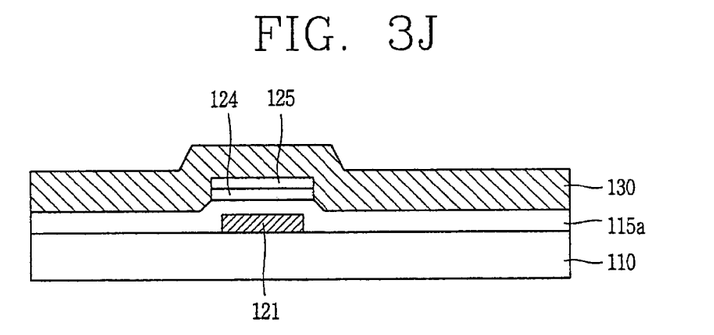
Figure 3K:
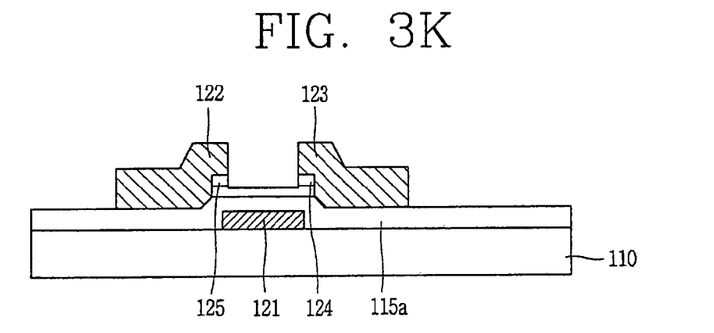

And, as shown in FIGS. 3J and 3K, a conductive metal 130 for source/drain electrodes is deposited at the entire surface of the resultant substrate 110, and then the conductive metal 130 is patterned through a photolithography process, thereby forming a source electrode 122 and a drain electrode 123.

The conductive metal 130 and the n+ amorphous silicon thin film 125 are completely removed except for their portions corresponding to the source/drain electrodes 122, 123 patterns.

Figure 3L:
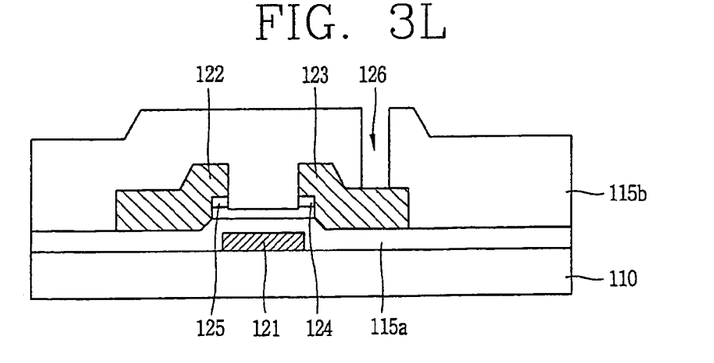

Next, as shown in FIG. 3L, a second insulating film 115b is deposited at the entire surface of the substrate 110, and then a contact hole 126 exposing a part of the drain electrode 123 is formed through a photolithography process.

Figure 3M:
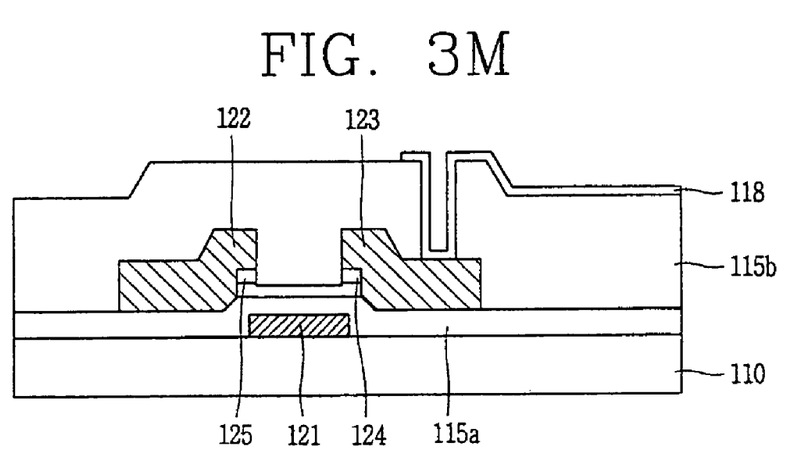

And, as shown in FIG. 3M, a transparent conductive material such as Indium Tin Oxide (ITO) is deposited at the entire surface of the substrate 110 on which the second insulating film 115b is formed, and then a pixel electrode 118 electrically connected to the drain electrode 123 through the contact hole 126 is formed through a photolithography process.

As so far described, in the method for forming a pattern by the microtransfer method, a surface of a thin film to be patterned contacts a surface of a mold having an intaglio portion corresponding to the pattern so as to transfer the photosensitive material injected in the intaglio portion to the surface of the thin film, and then the thin film is etched by a general etching process, whereby a desired pattern is formed. Thus, unlike the related art photolithography method, an alignment process, an exposure process and a development process due to a use of a mask are not required. Accordingly, the fabrication cost and process of a liquid crystal display device can be reduced greatly.

In addition, in the method for forming a pattern in accordance with the present embodiment, a master substrate having a mold can be fabricated, corresponding to a desired size of a display device, and a desired pattern can be formed at a substrate by one transfer, so that a pattern can be simply formed even for a large-sized liquid crystal display device.

In addition, the method for forming a pattern by the microtransfer method according to the present invention is used to form a gate electrode and an active pattern. However, the method can be used to form a different pattern for a thin film transistor, to form a color filter pattern for a color filter substrate of a liquid crystal display device, or to form a pattern for a display device.

Meanwhile, in the present embodiment, an intaglio portion of a mold for molding an active pattern is formed in a concave groove shape having a width similar to that of a gate electrode because layers on a gate electrode are stepped at a higher height compared to their other portions.

However, since the photosensitive material injected into the groove of the mold is in a jell state having a certain fluidity until the photosensitive material is hardened by the light radiation, an intaglio portion having a width enough for stepped portions to completely sink to the photosensitive material, that is, an active pattern, may be formed. An embodiment thereabout will now be described.

Figure 4A:
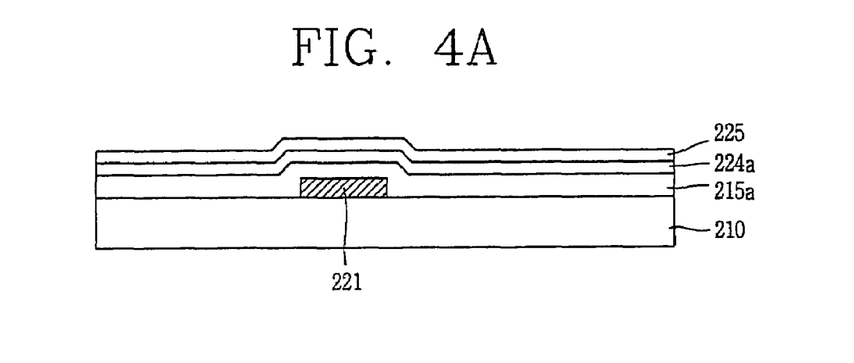
FIGS. 4A to 4C are flow charts showing a process for forming an active pattern in accordance with a second embodiment of the present invention.
Figure 4B:
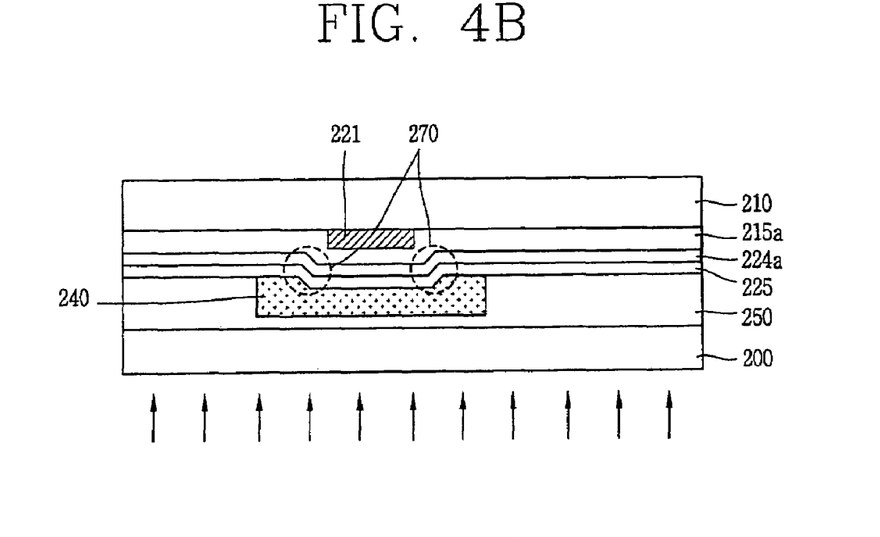
Figure 4C:
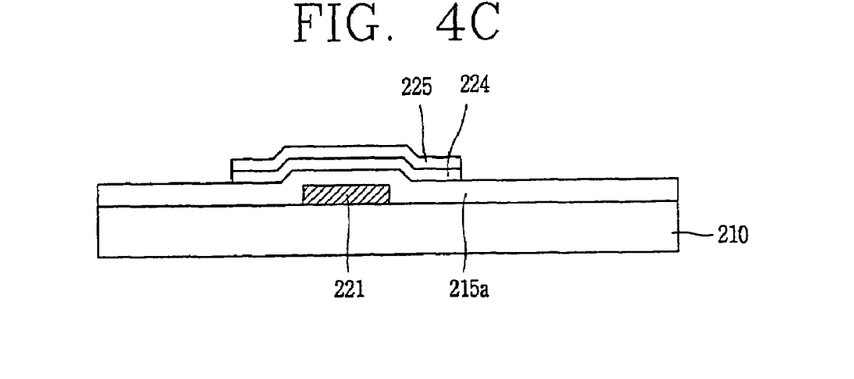

FIGS. 4A to 4C are flow charts showing a process for forming an active pattern in accordance with a second embodiment of the present invention.

First, a gate electrode 221 is formed on a substrate 210 in the same manner as the first embodiment, and then, as shown in FIG. 4A, a first insulating film 215a, an amorphous silicon thin film 224a and an n+ amorphous silicon thin film 225 are deposited at the entire surface of the resultant substrate 210 in turn.

Next, as shown in FIG. 4B, a master substrate 200 including a mold 250 contacts the substrate 210, and then light is radiated from a lower side of the master substrate 200. The mold 250 has a concave intaglio portion corresponding to an active pattern, and the groove is filled with a photosensitive material 240.

Here, the groove formed at the mold 250 in accordance with the present embodiment has such a width so as to cover stepped portions 270 of layers on the gate electrode 221 of the substrate 210 in order to form an active pattern having a sufficiently wide width compared to the active pattern according to the first embodiment.

Thereafter, the photosensitive material 240 injected into the mold 250 is hardened by the radiated light and transferred to a surface of the n+ amorphous silicon thin film 225 on the substrate 210.

Next, as shown in FIG. 4C, by using the transcribed photosensitive film pattern 240 as a mask, the n+ amorphous silicon thin film 225 and the amorphous silicon thin film 224a are etched, to thereby form the active pattern 224 and the ohmic contact layer 225.

Thereafter, the same process described in FIGS. 3J to 3M of the first embodiment is performed.

Although FIGS. 3A-4C show one TFT and pixel region, the present invention encompasses the process of forming an array of TFTs and pixel regions of a liquid crystal display device.

It will be apparent to those skilled in the art that various modifications and variation can be made in the method for forming pattern of liquid crystal display device and method for fabricating liquid crystal display device of the present inventions without departing from the spirit or scope of the invention. Thus, it is intended that the present cover the modifications and variations of this invention provided they come within the scope of the appended claims and their equivalents.

What is claimed is:

1. A method for forming a pattern of a liquid crystal display device, comprising:
   providing a substrate having a layer to be patterned;
   providing a master substrate having an intaglio portion corresponding to a desired pattern;
   filling an organic material into the intaglio portion of the master substrate;
   placing the master substrate in contact with the substrate;
   hardening the organic material to produce a hardened organic film pattern;
   transferring the hardened organic film pattern onto a surface of the layer to be patterned by separating the master substrate from the substrate; and
   etching the layer to be patterned by using the organic film pattern as a mask.

2. The method of claim 1, wherein the master substrate includes a mold having the intaglio portion.

3. The method of claim 2, wherein the mold is made of a transparent elastic resin.

4. The method of claim 3, wherein the transparent elastic resin is PDMS (polydimethylsiloxane).

5. The method of claim 1, wherein the organic material is a photosensitive material.

6. The method of claim 5, wherein the photosensitive material is photoresist.

7. The method of claim 1, wherein the layer to be patterned is an insulating layer, a semiconductor layer, or a metal layer.

8. The method of claim 1, wherein the filling step fills in the intaglio portion from a first side of the master substrate.

9. The method of claim 8, wherein the hardening step includes irradiating light onto a second side of the master substrate.

10. The method of claim 9, wherein the first and second sides of the master substrate are opposite sides.

11. The method of claim 1, wherein the filling of the organic material is made by a spin coating method, an inkjet printing method, or a knife jetting method.

12. A method for fabricating a thin film transistor (TFT) array substrate for a liquid crystal display device, comprising:
   providing a first substrate;
   forming a gate metal on the first substrate;
   filling an organic material into the intaglio portion of a master substrate;
   placing the master substrate in contact with the first substrate;
   hardening the first organic material to produce a hardened first organic film pattern;
   transferring the hardened first organic film pattern onto the gate metal by separating the master substrate from the first substrate;
   forming a gate electrode by etching the gate metal by using the first organic film pattern as a mask;
   depositing a first insulating film, an amorphous silicon thin film and an n+ amorphous silicon thin film on the first substrate on which the gate electrode is formed;
   forming an active pattern by patterning the n+ amorphous silicon thin film and the amorphous silicon thin film;

forming a source electrode and a drain electrode on the active pattern;

forming a second insulating film having a contact hole exposing a part of the drain electrode; and forming a pixel electrode electrically connected to the drain electrode through the contact hole.

13. The method of claim 12, wherein the step of forming the active pattern comprises:

transferring a second organic film pattern onto the first substrate; and forming the active pattern by etching the n+ amorphous silicon thin film and the amorphous silicon thin film by using the second organic film pattern as a mask.

14. A method for fabricating a thin film transistor (TFT) array substrate of liquid crystal display device, comprising:

providing a first substrate;

forming a gate electrode on the first substrate;

depositing a first insulating film, an amorphous silicon thin film and an n+ amorphous silicon thin film on the first substrate on which the gate electrode is formed;

filling an organic material into the intaglio portion of a master substrate;

placing the master substrate in contact with the first substrate;

hardening the organic material to produce a hardened organic film pattern;

transferring the hardened organic film pattern onto the first substrate by separating the master substrate from the first substrate;

forming an active pattern by etching the n+ amorphous silicon thin film and the amorphous silicon thin film by using the organic film pattern as a mask;

forming a source electrode and a drain electrode on the active pattern;

forming a second insulating film having a contact hole exposing a part of the drain electrode; and forming a pixel electrode electrically connected to the drain electrode through the contact hole.

15. The method of claim 14, wherein the organic film pattern has a width that covers stepped portions of layers on the gate electrode.

16. A method of forming a pattern of a display device, comprising:

providing a mold layer having a groove filled with a photosensitive material;

hardening the photosensitive material;

transferring the hardened photosensitive material onto a surface of a layer to be patterned; and patterning the layer to be patterned by using the transferred photosensitive material as a mask.

17. The method of claim 16, wherein the layer patterned by the patterning step is a gate electrode.

18. The method of claim 16, wherein the layer patterned by the patterning step is at least one of an active layer and an ohmic contact layer.

19. The method of claim 16, wherein the hardening step hardens the photosensitive material by irradiating light towards one surface of the mold layer.

20. The method of claim 16, wherein the transferring step includes:

placing the mold layer in contact with the layer to be patterned; and thereafter separating the mold layer from the layer to be patterned.

21. The method of claim 12, wherein the hardening step includes irradiating light to the organic film pattern in the master substrate.

22. The method of claim 14, wherein the hardening step includes irradiating light to the organic film pattern in the master substrate.

23. A method for fabricating a thin film transistor (TFT) array substrate for a liquid crystal display device, comprising:

providing a first substrate;

forming a gate metal on the first substrate;

providing a mold having a groove filled with a photosensitive material;

hardening the photosensitive material;

transferring the hardened photosensitive material onto the gate metal;

forming a gate electrode by etching the gate metal by using the transferred photosensitive material as a mask;

depositing a first insulating film, an amorphous silicon thin film and an n+ amorphous silicon thin film on the first substrate on which the gate electrode is formed;

forming an active pattern by patterning the n+ amorphous silicon thin film and the amorphous silicon thin film;

forming a source electrode and a drain electrode on the active pattern;

forming a second insulating film having a contact hole exposing a part of the drain electrode; and forming a pixel electrode electrically connected to the drain electrode through the contact hole.

24. The method of claim 23, wherein the hardening includes irradiating light to the photosensitive material in the mold.

25. A method for fabricating a thin film transistor (TFT) array substrate of liquid crystal display device, comprising:

providing a first substrate;

forming a gate electrode on the first substrate;

depositing a first insulating film, an amorphous silicon thin film and an n+ amorphous silicon thin film on the first substrate on which the gate electrode is formed;

providing a mold having a groove filled with a photosensitive material;

hardening the photosensitive material;

transferring the hardened photosensitive material onto the first substrate;

forming an active pattern by etching the n+ amorphous silicon thin film and the amorphous silicon thin film by using the transferred photosensitive material as a mask;

forming a source electrode and a drain electrode on the active pattern;

forming a second insulating film having a contact hole exposing a part of the drain electrode; and forming a pixel electrode electrically connected to the drain electrode through the contact hole.

26. The method of claim 25, wherein the hardening includes irradiating light to the photosensitive material in the mold.

* * * * *